United States Patent [19]

Iwamoto et al.

[11] Patent Number: 5,085,711
[45] Date of Patent: Feb. 4, 1992

[54] PHOTOVOLTAIC DEVICE

[75] Inventors: Masayuki Iwamoto, Itami; Koji Minami, Higashiosaka; Kaneo Watanabe, Anpachi, all of Japan

[73] Assignee: Sanyo Electric Co., Ltd., Osaka, Japan

[21] Appl. No.: 480,453

[22] Filed: Feb. 15, 1990

[30] Foreign Application Priority Data

Feb. 20, 1989 [JP] Japan .................... 1-39921
Feb. 20, 1989 [JP] Japan .................... 1-39922

[51] Int. Cl.⁵ .................... H01L 31/06; H01L 31/075
[52] U.S. Cl. .................... 136/258; 357/30
[58] Field of Search ......... 136/256, 258 PC, 258 AM; 357/30 J, 30 K

[56] References Cited

U.S. PATENT DOCUMENTS 3,990,914 11/1976 Weinstein et al. .................... 136/246
4,677,250 6/1987 Barnett et al. .................... 136/258 PC

FOREIGN PATENT DOCUMENTS 0276961 8/1988 European Pat. Off. ...... 136/258 PC
56-94677 7/1981 Japan ............................ 136/258 AM
60-210825 10/1985 Japan ............................ 136/258 AM

OTHER PUBLICATIONS

"Microstructure and Conductivity of P Doped $\mu c$-Si:H", By: H. Itosaki et al., Technical Digest of the International PVSEC-1, pp. 707-710 (Nov. 1984).

"Improvements of Interfaces in Tandem-Type Amorphous Silicon Alloy Solar Cells", By: H. Sasaki et al., Technical Digest of the International PVSEC-2, pp. 467-470 (Aug. 1986).

Tawada et al., *Jap. Journal Applied Physics*, 21 (Supp. 21-1) pp. 297-303 (1982).

*Primary Examiner*—Aaron Weisstuch
*Attorney, Agent, or Firm*—Armstrong, Nikaido, Marmelstein, Kubovcik & Murray

[57] ABSTRACT

A photovoltaic device capable of obtaining a high open circuit voltage, in which crystallization of a semiconductor is accelerated from the first stage of formation thereof such that a thin layer of the semiconductor is crystallized, by doping an electrode disposed between the semiconductor and a substrate with an element which reacts with an element in the semiconductor to accelerate crystallization of the semiconductor or by disposing a film made from a compound doped with said element between the semiconductor and the substrate.

19 Claims, 7 Drawing Sheets

PHOTOVOLTAIC DEVICE

BACKGROUND OF THE INVENTION

1. Field of the Invention

The present invention relates to a photovoltaic device used in solar generation of electric power, optical detection, and the like.

2. Description of Related Art

A photovoltaic device with an amorphous semiconductor as a photo-active layer is already known. It basically comprises a transparent substrate made of glass or the like, on which a lightreceiving-side electrode made from transparent conductive oxides (hereinafter denoted as TCO for short), such as ITO or $SnO_2$, a semiconductor film having a semiconductor junction, such as pn and pin type, and a back electrode in ohmic contact with said semiconductor film, layered in this order.

Also, a photovoltaic device comprising a metallic substrate made of stainless steel or the like on which a semiconductor film with a semiconductor junction and a light-receiving-side electrode made from TCO layered in this order is known.

Almost all of the existing photovoltaic devices, in order to minimize the absorption of light in a p-type or n-type conductivity type impurity doped layer disposed on the light receiving side and obtain a higher open circuit voltage ($V_{oc}$), employ hydrogenated amorphous silicon carbide (hereinafter denoted as a-SiC:H for short) having a wide band gap as this impurity doped layer. In the latest investigations, in order to obtain a still higher $V_{oc}$, a film formed of hydrogenated microcrystalline silicon carbide (hereinafter described μc-SiC:H for short), for example, has been tried in place of the a-SiC:H film as an impurity doped layer disposed on the light receiving side or the opposite side (H. Sasaki et al. : *Proc. of Int'l PVSEC-2* pp 467–470 (Aug. 1986)).

When forming a microcrystalline impurity doped semiconductor film by a glow discharge capable of forming an amorphous semiconductor, the impurity doped layer is not significantly microcrystalline during the first stage of the film-formation, and remains amorphous. Since the film-thickness is limited, the impurity doped layer of which only a slight thin part is microcrystallized, exhibits no effect due to microcrystallization. If it is intended to microcrystallize the impurity layer in a sufficient thickness for achieving the desired effects of microcrystallization, the thickness of the impurity layer must be extremely thick, e.g. to an extent of 400 Å (H. Itozaki et al. : *Proc. of Int'l. PVSEC-1* pp 707–710 (Nov. 1984)). As a result, since light is now absorbed in the impurity layer, the short-circuit current ($I_{sc}$) is reduced. In addition, since the film formed in the first stage is amorphous, the $V_{oc}$ is reduced.

In order to microcrystallize an impurity doped layer of limited thickness, a special apparatus, such as an apparatus for producing semiconductors by an ECR plasma, is indispensable. However, this is a great hindrance for practical use.

SUMMARY OF THE INVENTION

The present invention has been achieved for solving the above described problems and it is a main object of the present invention to provide a photovoltaic device in which a semiconductor film is microcrystallized by first forming a film having an element which reacts with a semiconductor film laid on a conductive surface of a substrate to accelerate crystallization of the semiconductor film on a part or all of said conductive surface of the substrate or by adding the element to the conductive surface to accelerate crystallization of the semiconductor film during the first stage of its formation thereby to microcrystallize the semiconductor.

The above and further objects and features of the invention will more fully be apparent from the following detailed description taken with the accompanying drawings.

DESCRIPTION OF THE PREFERRED EMBODIMENTS

Figure 1:
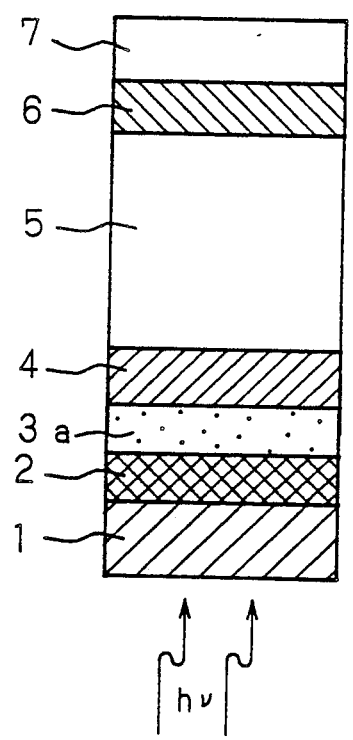
FIG. 1 is a schematic sectional view showing the construction of a photovoltaic device of the present invention.

FIG. 1 is a schematic sectional view showing the construction of the first example of the photovoltaic device of the present invention. Referring now to FIG. 1, reference numeral 1 designates a substrate formed of a transparent material such as glass. On said substrate 1 is a light-receiving-side electrode 2 made from TCO, such as $SnO_2$ or ITO, over the entire surface thereof. On said light-receiving-side electrode 2 is a $Si_xN_y$ film 3a made from silicon containing nitrogen (hereinafter denoted as $Si_xN_y$ for short: wherein x=1 to 3, y=1 to 4). On said $Si_xN_y$ layer 3a is a p-type impurity doped layer (hereinafter denoted as p-type layer for short) 4 formed of a hydrogenated microcrystallized silicon carbide (hereinafter denoted as μc-SiC:H for short) film doped with an element of group III of the periodic table, such as B or Al. On said p-type layer 4 is an intrinsic or a substantially intrinsic photo-active layer 5 formed of a hydrogenated amorphous silicon (hereinafter denoted as a-Si:H for short) film. On said photo-active layer 5 is an n-type impurity doped layer (hereinafter denoted as n-type layer for short) formed of an a-Si:H film doped with an element of group V of the periodic table, such as P or As. On said n-type layer 6 is a back electrode film 7 made from Al, Ag, Cr, TCO/Ag, TCO/Cr, Al/Ti, Al/TiAg, Al/Ag, or the like.

The $Si_xN_y$ film 3a, p-type layer 4, photo-active layer 5 and n-type layer 6 are formed by the plasma decomposition method silicon compound gas as the main raw material gas. The basic film-forming conditions for obtaining these layers by the plasma decomposition method are shown in Table 1.

TABLE 1

| | Gas Composition | RF Power (W) | Film-thickness (Å) |
| --- | --- | --- | --- |
| $Si_xN_y$ film | $NH_3/SiH_4$ = 1 | 30 | 10~100 |
| p-type Layer | $CH_4/SiH_4$ = 50%<br>$B_2H_6/SiH_4$ = 1%<br>$SiH_4/H_2$ = 1% | 100 | 50~150 |
| Photo-active Layer | $SiH_4$ = 100% | 20 | 4000~6000 |
| n-type Layer | $PH_3/SiH_4$ = 2% | 20 | 300~500 |
| Common conditions: | Substrate temperature: 200° C.<br>Reaction Pressure: 0.3 Torr | | |

TABLE 1-continued

| Gas Composition | RF Power (W) | Film-thickness (Å) |
|---|---|---|
| RF frequency: 13.56 MHz | | |

It has been confirmed by IMA that the value of x of the $Si_xN_y$ film 3a obtained under the above described film-forming conditions is 3 and the value of y is 4. This $Si_xN_y$ film 3a is formed prior to the p-type layer 4 and acts like a nucleus for microcrystallizing the p-type layer 4. The p-type layer 4 is microcrystallized from the first stage of film-formation, coupled with a high concentration of hydrogen in the raw material gas during the film-formation.

Figure 2:
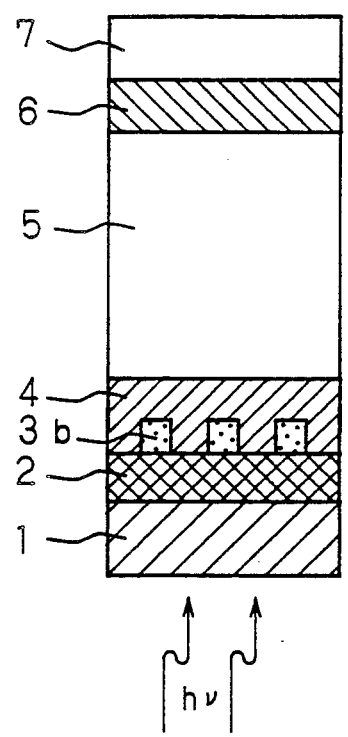
FIGS. 2–5 are schematic sectional views showing constructions of photovoltaic devices of the other preferred embodiments of the present invention.

FIG. 2 is a schematic sectional view showing the construction of a second example of a photovoltaic device of the present invention. In this example, $Si_xN_y$ film 3b is arranged like islands at the boundary between the light-receiving-side electrode 2 and the p-type layer 4 at intervals of about 5 μm, for instance, in place of the $Si_xN_y$ film 3a in the first example. The other layers are the same as in the first example. The islands of the $Si_xN_y$ film 3b are, for example, regular squares where one side is about 5 μm in length, and the adjacent islands are separated from each other. The light-receiving-side electrode 2 is in direct contact with the p-type layer 4 in the spaces between the adjacent islands of the $Si_xN_y$ film 3b. Since $Si_xN_y$ is essentially an insulating material, in such a construction in which the entire surface of the light-receiving-side electrode 2 is covered with $Si_xN_y$ as shown in the first e>:ample, the series resistance is increased. In the second example, the p-type layer 4 is partially in direct contact with the light-receiving-side electrode 2 thereby preventing an increase in the series resistance. The p-type layer 4 reacts by contacting the $Si_xN_y$ film 3b and thus is microcrystallized immediately after starting the film-formation thereof.

Figure 3:
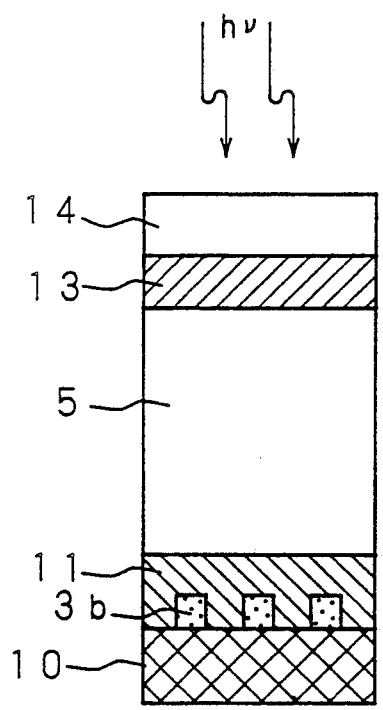

FIG. 3 is a schematic sectional view showing the construction of a third example of a photovoltaic device of the present invention. In the first and second examples, the substrate is formed of a transparent material, such as glass, and the impurity doped layer on the light receiving side is microcrystallized. In the third example, a substrate 10 is formed of metal, such as stainless steel, or metal-coated glass. Light enters the device from the side opposite of the substrate 10. In this embodiment, the impurity doped layer on the side opposite the light incident side is to be microcrystallized. Islands of $Si_xN_y$ film 3b formed on the surface of a metal substrate 10 or on the metal-coated surface of a substrate 10 in the same manner as in the second example. On the surface of the substrate 10 where the $Si_xN_y$ film 3b is formed, an n-type layer 11 formed of a hydrogenated microcrystallized silicon (hereinafter denoted as μc-Si:H for short) film, a photo-active layer 5, a p-type layer 13 formed of an a-SiC:H film, and a light-receiving-side electrode 14 made from TCO are formed in this order. The n-type layer 11 reacts by contacting the $Si_xN_y$ film 3b and thus is microcrystallized immediately after starting the film-formation thereof.

Figure 4:
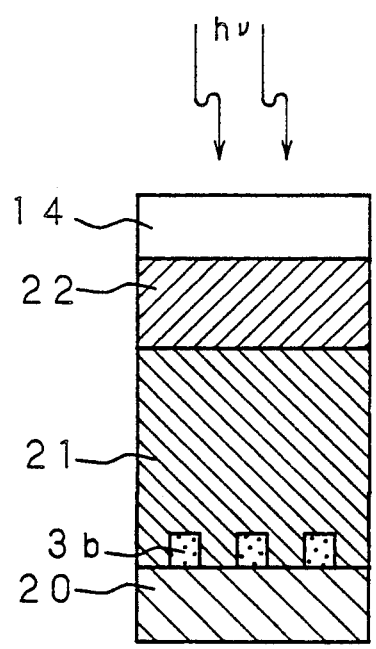

FIG. 4 is a schematic sectional view showing the construction of a fourth example of a photovoltaic device of the present invention. In this example, polycrystalline silicon, obtained by the thermal CVD method, is used as a semiconductor film. Referring to FIG. 4, reference numeral 20 designates a substrate formed of stainless steel or the like, enduring temperatures (600 to 1,000° C.) applied for the thermal CVD and being conductive. On the substrate 20 the $Si_xN_y$ film 3b is formed thereon as islands as in the third example by the plasma decomposition method. An n-type layer 21 formed of polycrystalline silicon is then formed on the surface of the substrate 20 where the $Si_xN_y$ film 3b is formed. The n-type layer 21 is brought into direct contact with a conductive surface of the substrate 20. On the n-type layer 21, a p-type layer 22 formed of polycrystalline silicon and forming a semiconductor junction with the n-type layer 21 is deposited. A light-receiving-side electrode 14 made from TCO is formed on the p-type layer 22. The n-type layer 21 reacts by contacting the $Si_xN_y$ film 3b during the film-formation by the thermal CVD method, thus providing a polycrystalline film with large particle diameters commencing from the first stage of film-formation.

Table 2 shows the characteristics of the photovoltaic devices according to the first through fourth examples and the first through third comparison devices, which are partially different in construction from the examples, measured under the irradiation of AM-1 and 100mW/cm².

The first comparison photovoltaic device has the same construction as in the first and second examples without the $Si_xN_y$ films 3a, 3b; the second comparison photovoltaic device has the same construction as in the third example without the $Si_xN_y$ film 3b; and the third comparison photovoltaic device has the same construction as in the fourth example without the $Si_xN_y$ film 3b.

TABLE 2

| | Open-circuit Voltage (V) | Short-circuit Current (mA/cm²) | Shape Factor | Conversion Efficiency (%) |
|---|---|---|---|---|
| Example 1 | 0.96 | 16.2 | 0.66 | 10.3 |
| Example 2 | 0.96 | 16.3 | 0.69 | 10.8 |
| Example 3 | 0.91 | 15.8 | 0.68 | 9.78 |
| Example 4 | 0.64 | 30.2 | 0.74 | 14.3 |
| Comparison 1 | 0.88 | 16.0 | 0.68 | 9.57 |
| Comparison 2 | 0.86 | 15.7 | 0.67 | 9.05 |
| Comparison 3 | 0.60 | 28.1 | 0.72 | 12.1 |

As is obvious from Table 2, in the first through fourth examples of the present invention, the open-circuit voltage is larger than that of the first through third comparisons. Also, the conversion efficiency is improved as a result of the larger opencircuit voltage. In the photovoltaic devices of the present invention, the impurity layers brought into contact with the $Si_xN_y$ films are microcrystallized or polycrystallized from the first stage of the film-formation. Accordingly, the reduction of the built-in potential due to the existence of amorphous portions as in the comparisons is reduced, and as a result, the open-circuit voltage is increased.

Figure 5:
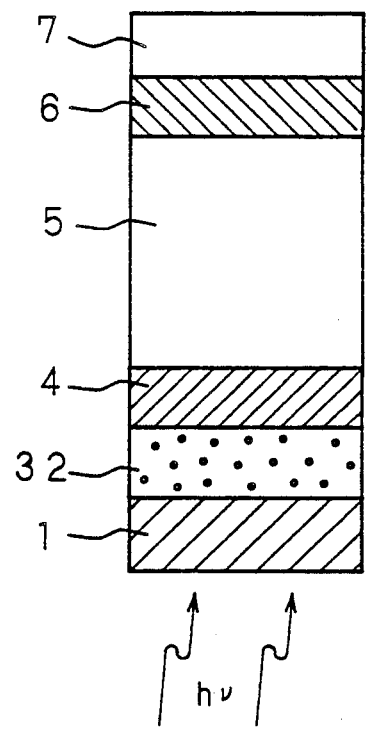

FIG. 5 is a schematic sectional view showing a fifth example of a photovoltaic device of the present invention. Referring to FIG. 5, reference number 1 designates a substrate formed of a transparent material such as glass. A light-receiving-side electrode 32 formed of TCO, such as $SnO_2$ or ITO, doped with nitrogen, phosphorus or the like is formed on the substrate 1. On the light-receiving-side electrode 32 are formed the same p-type layer 4, photo-active layer 5, n-type layer 6 and back electrode 7 as in the first and second examples, in this order. This example is characterized in that an element, such as nitrogen or phosphorus, reacting with Si, a constituent element of a μc-SiC:H semiconductor film subsequently laid on the light-receiving-side electrode 32, is doped into the light-receiving-side electrode 32 to accelerate crystallization of the semiconductor film.

Figure 6A:
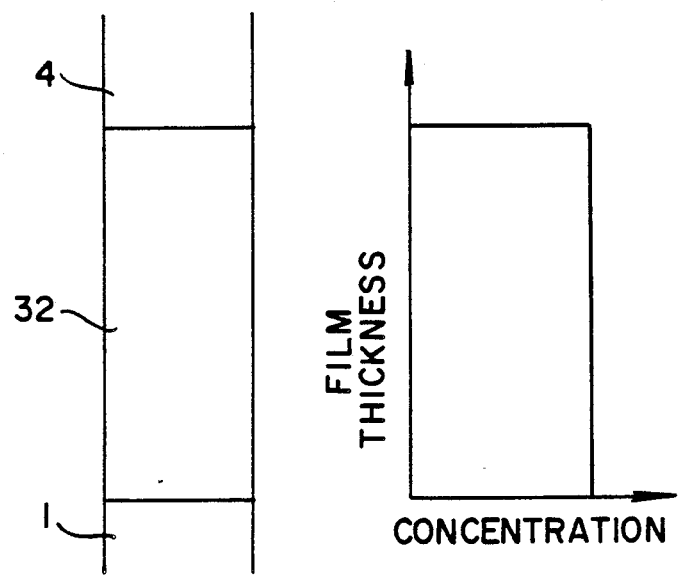
FIGS. 6a–6c are diagrams showing the distribution of concentration of a crystallization accelerating element in a light-receiving-side electrode.
Figure 6B:
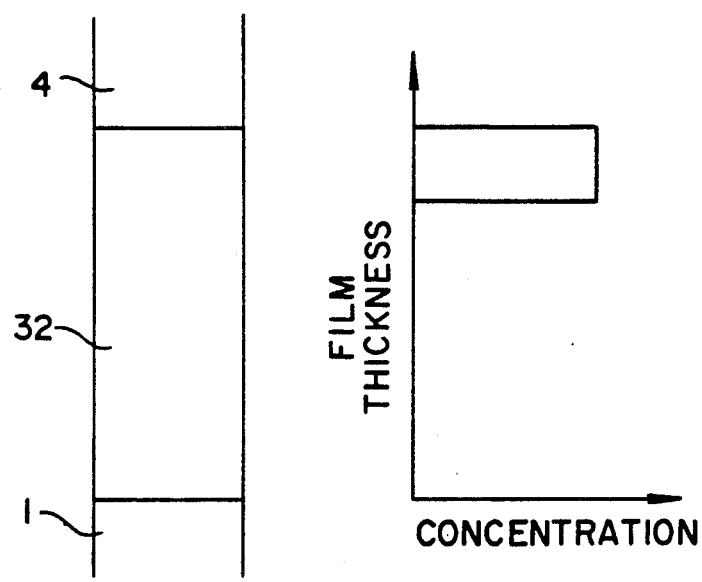
Figure 6C:
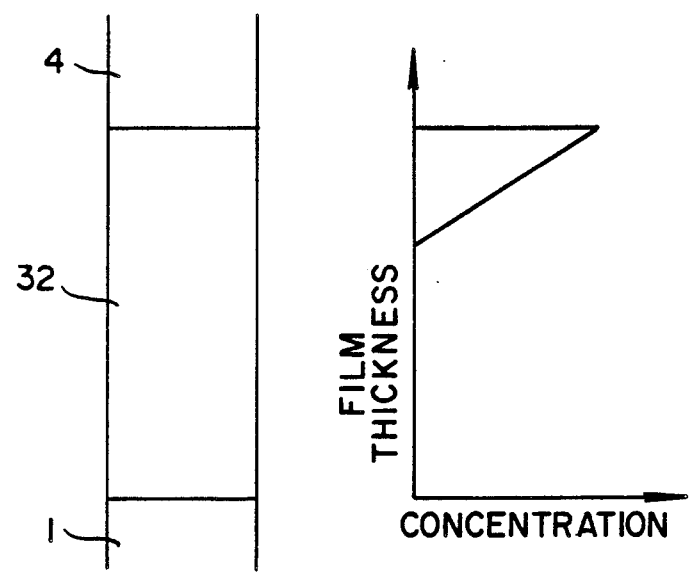

FIGS. 6a-c are diagrams showing the distribution of concentration of the crystallization accelerating element in the light-receiving-side electrode 32. FIG. 6(a) shows the distribution in the case where this element is doped uniformly in the direction of film-thickness. FIG. 6(b) shows the distribution in the case where this element is doped merely at the boundary with the p-type layer 4. FIG. 6(c) shows the distribution in the case where this element is doped from the middle of the direction of film-thickness so as to be at a maximum in quantity at the boundary with the p-type layer 4. In every case, the concentration at the boundary with the p-type layer 4 side is suitable at 1 to 10 at. %. The distribution of the crystallization accelerating element can be easily adjusted by controlling the quantity of materials used in the film-formation of the light-receiving-side electrode 32.

One method of forming the light-receiving-side electrode 32 formed of nitrogen-doped $SnO_2$ is described below. The light-receiving-side electrode 32 having a film-thickness of about 3,000 to 10,000 Å is obtained by the thermal CVD method by heating the substrate 1 to about 500 to 600° C. and forming a film with $SnCl_4$ at a flow rate of 1 to 10g/min, $O_2$ at a flow rate of 0.1 to 10 λ/min and $NH_3$ at a flow rate of 0.1 to 20 λ/min. In the case where the sheet resistance of the obtained light-receiving-side electrode 32 is high, the sheet resistance can be reduced by doping a suitable quantity of fluorine or antimony. The electron beam evaporation method, the reactive sputtering method or the like may be used as the film-forming method rather than the thermal CVD method.

On the resulting light-receiving-side electrode 32 the p-type layer 4, the photo-active layer 5 and the n-type layer 6 are formed by the plasma sputtering method under the film-forming conditions as shown in Table 3.

TABLE 3

| | Gas Composition | RF Power | Film-thickness (Å) |
|---|---|---|---|
| p-type Layer | $CH_4/SiH_4$ = 50% $B_2H_6/SiH_4$ = 1% $SiH_4H_2$ = 1% | 100 | 50~100 |
| Photo-active Layer | $SiH_4$ = 100% | 20 | 4000~6000 |
| n-type Layer | $PH_3/SiH_4$ = 2% | 20 | 300~500 |
| Common conditions: | Substrate temperature: 200° C. Reaction temperature: 0.3 Torr RF frequency: 13.56 MHz | | |

Subsequently, a back electrode 7 of Al of bout 5,000 Å to 1 μm in thickness is formed by evaporation. The photovoltaic characteristics of the device obtained in the above described manner and of the comparisons shown in Table 4 were measured under an irradiation of AM-1, 100 mW/cm². The light-receiving-side electrode 32 in the fifth example is formed of $SnO_2$ film of about 5,000 Å in thickness doped with nitrogen as a crystallization accelerating element in a thickness of about 1,000 Å at the boundary of the p-type layer 4. The light-receiving-side electrode 32 in the comparison is formed of $SnO_2$ film of about 5,000 Å in thickness without nitrogen doping. For exactness, a device, on which a semiconductor film is formed at the same time as the fifth example under the film-forming conditions such as shown in Table 3, is used as the comparison.

TABLE 4

| | Open-circuit Voltage (V) | Short-circuit Current (mA/cm²) | Shape Factor | Conversion Efficiency (%) |
|---|---|---|---|---|
| Example 5 | 0.98 | 16.9 | 0.72 | 11.9 |
| Comparison | 0.90 | 16.8 | 0.71 | 10.7 |

As shown in Table 4, in the fifth example, the open-circuit voltage is increased and the efficiency of photovoltaic conversion is improved compared with that of the comparison. It is presumed that μc-SiC:H in the p-type layer 4 reacts with the element added to the light-receiving-side electrode 32 to be microcrystallized immediately from the boundary of the p-type layer 4 on the light-receiving-side electrode 32 side, thereby increasing the built-in potential of the p-type layer 4.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A photovoltaic device with a substrate and a multiplicity of layers formed in overlying sequence on a surface of the substrate, comprising:

an electrode on said surface of the substrate; and a semiconductor layer comprising a microcrystalline semiconductor layer and an amorphous semiconductor layer, with said microcrystalline semiconductor layer on said electrode;

wherein a film containing an element which reacts with an element in said microcrystalline semiconductor layer to accelerate microcrystallization of said microcrystalline semiconductor layer is disposed at the boundary between said electrode and said microcrystalline semiconductor layer and wherein said element in said film is selected from the group consisting of nitrogen and phosphorus.

2. A Photovoltaic device as set forth in claim 1, wherein said film is formed of silicon containing nitrogen.

3. A photovoltaic device as set forth in claim 1, wherein said film is disposed all over said electrode.

4. A Photovoltaic device as set forth in claim 1, wherein said film is arranged like islands on a surface of said electrode.

5. A Photovoltaic device as set forth in claim 1, wherein said substrate is transparent.

6. A photovoltaic device as set forth in claim 1, wherein said substrate is conductive.

7. A photovoltaic device as set forth in claim 1, wherein said surface of the substrate is coated with a conductive film serving as said electrode.

8. The photovoltaic device of claim 1, wherein said element is phosphorus.

9. A photovoltaic device with a substrate and a multiplicity of layers formed in overlying sequence on a surface of the substrate, comprising:

an electrode on said surface of the substrate; and
a semiconductor comprising a microcrystalline semiconductor layer and an amorphous semiconductor layer, with said microcrystalline semiconductor layer on said electrode;
wherein said electrode is doped with an element which reacts with an element in said microcrystalline semiconductor layer to accelerate crystallization of said microcrystalline semiconductor layer, and wherein said element is selected from the group consisting and nitrogen or phosphorus.

10. A photovoltaic device as set forth in claim 9, wherein said element accelerating crystallization of the semiconductor is nitrogen.

11. A photovoltaic device as set forth in claim 9, wherein said element accelerating crystallization of the semiconductor is phosphorus.

12. A photovoltaic device as set forth in claim 9, wherein said substrate is transparent.

13. A Photovoltaic device as set forth in claim 9, wherein said substrate is conductive.

14. A photovoltaic device as set forth in claim 9, wherein said substrate is coated with a conductive material serving as said electrode.

15. A Photovoltaic device as set forth in claim 9, wherein said electrode is uniformly doped with said element.

16. A photovoltaic device as set forth in claim 9, wherein said electrode is so doped with said element that the concentration of said element is greater on the side in contact with said semiconductor.

17. A photovoltaic device as set forth in claim 9, wherein said electrode is doped with said element only on the side in contact with said semiconductor.

18. A photovoltaic device as set forth in claim 17, wherein the concentration of said element doped in said electrode on the side in contact with said semiconductor is 1 to 10 at. %.

19. The photovoltaic device of claim 9, wherein said element is nitrogen.

* * * * *